United States Patent
Sender et al.

(10) Patent No.: US 11,047,653 B1
(45) Date of Patent: Jun. 29, 2021

(54) AUTOMATIC HIT DETECTION IN A SHOOTING TARGET HAVING MULTIPLE CONDUCTIVE INKS

(71) Applicant: Plan Alpha Ltd., Ra'anana (IL)

(72) Inventors: Haim Sender, Ganei Tal (IL); Tamir Weiss, Nechusha (IL)

(73) Assignee: Plan Alpha Ltd., Ra'Anana (IL)

( * ) Notice: Subject to any disclaimer, the term of this patent is extended or adjusted under 35 U.S.C. 154(b) by 142 days.

(21) Appl. No.: 16/391,318

(22) Filed: Apr. 23, 2019

Related U.S. Application Data (60) Provisional application No. 62/666,119, filed on May 3, 2018.

(51) Int. Cl.
| | |
|---|---|
| *F41J 5/048* | (2006.01) |
| *F41J 5/052* | (2006.01) |
| *G01R 19/00* | (2006.01) |
| *G01R 19/12* | (2006.01) |
| *C09D 11/52* | (2014.01) |

(52) U.S. Cl.
CPC ............ *F41J 5/048* (2013.01); *F41J 5/052* (2013.01); *G01R 19/0084* (2013.01); *G01R 19/0092* (2013.01); *G01R 19/12* (2013.01); *C09D 11/52* (2013.01)

(58) Field of Classification Search
CPC ..... F41J 5/048; F41J 5/00; F41J 5/052; G01R 19/0084; G01R 19/0092; G01R 19/12
USPC ........................................................ 273/373
See application file for complete search history.

(56) References Cited

U.S. PATENT DOCUMENTS

| | | | |
|---|---|---|---|
| 4,357,531 | A | 11/1982 | Knight |
| 8,523,185 | B1 | 9/2013 | Gilbreath et al. |
| 2014/0091816 | A1 | 4/2014 | Hodge |
| 2015/0369572 | A1 | 12/2015 | Smolka |
| 2016/0379414 | A1 | 12/2016 | Brown et al. |
| 2017/0045338 | A1* | 2/2017 | McGovern ............... F41J 1/01 |
| 2017/0059285 | A1* | 3/2017 | Crivolio ................... F41J 5/14 |
| 2018/0372458 | A1 | 12/2018 | Janssen |

FOREIGN PATENT DOCUMENTS

WO   WO-2008033839 A2 * 3/2008 ............... F41J 5/041

OTHER PUBLICATIONS

Trainshot., "Trainshot electronic unit & targets manual", pp. 1-11, year 2018.
Trainshot., "Trainshot extender manual", pp. 1-3, year 2018.
Trainshot., "Trainshot long range communication unit", pp. 1-5, year 2018.
Trainshot., "Interactive smart shooting reactive targets", pp. 1-5, year 2018.
Trainshot., "Kits for smart target shooting", pp. 1-7, year 2018.

* cited by examiner

*Primary Examiner* — Eugene L Kim
*Assistant Examiner* — Rayshun K Peng
(74) *Attorney, Agent, or Firm* — Finnegan, Henderson, Farabow, Garrett & Dunner, LLP (57) ABSTRACT

A shooting target assembly includes a substrate and first and second patterns. The first pattern is disposed on a first section of the substrate and includes a first conductive ink having a first electrical conductivity. The second pattern is disposed on a second section of the substrate and includes a second conductive ink having a second electrical conductivity, different from the first electrical conductivity.

21 Claims, 6 Drawing Sheets

AUTOMATIC HIT DETECTION IN A SHOOTING TARGET HAVING MULTIPLE CONDUCTIVE INKS

CROSS-REFERENCE TO RELATED APPLICATIONS

This application claims the benefit of U.S. Provisional Patent Application 62/666,119, filed May 3, 2018, whose disclosure is incorporated herein by reference.

FIELD OF THE INVENTION

The present invention relates generally to target shooting, and particularly to automated hit detection in shooting targets.

BACKGROUND OF THE INVENTION

Various techniques for practicing and visualizing target shooting sessions are known in the art.

For example, U.S. Patent Application Publication 2016/0379414 describes an augmented reality (AR) system comprising a head mounted display (HMD) configured to display one or more AR visualizations within an operator's field of view (FOV). The system further comprises a control system including a processor and a storage system configured to store machine readable instructions, sensors configured to determine at least location and/or orientation of said sensors including a head mounted and device mounted sensor, and a communication system configured to communicate data between elements of the AR system.

U.S. Pat. No. 8,523,185 describes a target shooting system that includes a gun which shoots a projectile at a target which is part of a target assembly. The target includes a sensor which senses a projectile hit, and passes an electronic signal to a target information processor located in the target assembly.

U.S. Pat. No. 4,357,531 describes an apparatus for training in marksmanship. The apparatus uses a computer to determine the position of strike of a projectile on a target and further detects a hit on the target, especially in the region of the edge of the target where the projectile position determination computer may produce some errors. The physical hit detection system of the present invention will "override" the computer in those instances where the projectile barely touches the edge of the target and the computer "sees" the projectile as having missed the target or vice versa.

SUMMARY OF THE INVENTION

Embodiments of the present invention that are described herein provide a shooting target assembly that includes a substrate and first and second patterns. The first pattern is disposed on a first section of the substrate and includes a first conductive ink having a first electrical conductivity. The second pattern is disposed on a second section of the substrate and includes a second conductive ink having a second electrical conductivity, different from the first electrical conductivity.

In some embodiments, the first and second patterns are electrically coupled to one another. In other embodiments, the first section includes at least a target zone and the second section includes a periphery area outside the target zone. In yet other embodiments, the first conductive ink includes one or more materials selected from a list consisting of: (a) platinum, (b) graphene, (c) graphite, and (d) carbon having an allotrope different than graphene or graphite.

In an embodiment, the second conductive ink includes one or more materials selected from a list consisting of: (a) platinum, (b) silver, (c) gold, (d) copper, (e) an alloy including silver and carbon, (f) an alloy including silver and chlorine, (g) an alloy including silver and nickel. In another embodiment, the shooting target assembly includes control circuitry, which is electrically coupled to at least one of the first and second sections and is configured to detect whether a physical hit of a projectile occurred at the first section or the second section. In yet another embodiment, the control circuitry is configured to distinguish between a physical hit at the first section and a physical hit at the second section.

In some embodiments, the control circuitry is configured to flow a current via the first and second patterns, to sense a change in an electrical parameter across the first and second patterns, and to detect whether the physical hit occurred in the first section or in the second section based on the change in the electrical parameter. In other embodiments, the shooting target assembly includes additional first and second patterns disposed on additional first and second sections on the substrate, a reference conductor is common to the first and second patterns and to the additional first and second patterns, and the control circuitry is configured to flow the current via the reference conductor and an additional conductor, and to measure the electrical parameter between the common conductor and the additional conductor. In yet other embodiments, the control circuitry is configured to detect a hit event by analyzing changes of the electrical parameter over time.

In an embodiment, the electrical parameter includes a parameter selected from a list consisting of: (a) voltage, (b) electrical resistance, and (c) the electrical current. In another embodiment, the control circuitry is configured to hold at least one threshold, and to detect, based on the at least one threshold, whether the physical hit occurred at the first section or the second section. In yet another embodiment, the shooting target assembly includes a wireless communication device, which is connected to the control circuitry, and is configured to send a signal indicative of whether the physical hit occurred at the first section or the second section.

In some embodiments, at least one of the first and second conductive inks includes a material selected from a list consisting of: (a) silver, (b) copper, (c) gold, (d) aluminum, (e) calcium, (f) tungsten, (g) zink, (h) nickel, (i) lithium, (j) iron, (k) platinum, (l) tin, (m) gallium, (n) niobium, (o) lead, (p) titanium, (q) mercury, (r) manganese, and (s) carbon. In other embodiments, the first and second patterns include one or more electrical traces, and differ from one another in a spatial density of the electrical traces.

There is additionally provided, in accordance with an embodiment of the present invention, a shooting target assembly including a substrate, first and second sections, and control circuitry. The first and second sections include respective first and second different patterns of electrical traces disposed on the substrate. The control circuitry is electrically coupled to the first and second sections and is configured to detect and report whether a physical hit of a projectile occurred in the first section or in the second section.

In some embodiments, the first and second patterns are electrically coupled to one another. In other embodiments, the control circuitry is configured to flow a current via a series connection of the first and second sections, to sense a change in an electrical parameter across the series connection of the first and second sections, and to detect whether the physical hit occurred in the first section or in the second section based on the change in the electrical parameter. In yet other embodiments, the first and second patterns differ from one another in a spatial density of the electrical traces.

In an embodiment, the electrical parameter includes a parameter selected from a list consisting of: (a) voltage, (b) electrical resistance, and (c) the electrical current. In another embodiment, the first pattern includes a first conductive ink having a first electrical conductivity, and the second pattern includes a second conductive ink having a second electrical conductivity, different from the first electrical conductivity. In yet another embodiment, the first conductive ink includes one or more materials selected from a list consisting of: (a) platinum, (b) graphene, (c) graphite, and (d) carbon having an allotrope different than graphene or graphite, and the second conductive ink includes one or more materials selected from a list consisting of: (a) platinum, (b) silver, (c) gold, (d) copper, (e) an alloy including silver and carbon, (f) an alloy including silver and chlorine, (g) an alloy including silver and nickel.

There is additionally provided, in accordance with an embodiment of the present invention, a system for enriched visualization of target shooting, the system includes a processor and an output device. The processor is configured to: (i) receive an image, which shows a target and is acquired while a user is physically shooting a projectile at the target, (ii) receive, from a target assembly that includes the target, a signal indicative of a physical hit by the projectile, and (iii) in response to the signal, overlay on the image a visual indication of the hit, registered with the target. The output device is configured to display the image, with the overlaid visual indication of the hit, to the user.

In some embodiments, the target includes at least a target zone and a periphery area outside the target zone, and the processor is configured to determine, based on the signal, whether the physical hit occurred at one of the target zone or at the periphery area. In other embodiments, the system includes a controller, which is coupled to the target and is configured to determine whether the physical hit occurred at one of the target zones or at the periphery area, and to indicate to the processor, using the signal, a location at which the physical hit occurred. In yet other embodiments, the controller is configured to hold at least one threshold, and to detect, based on the at least one threshold, whether the projectile physically hit the target zone or the periphery area.

In an embodiments, the processor is configured to produce and overlay a visual indication indicative of a target or section currently valid for shooting. In another embodiment, in response to receiving the signal, the processor is configured to produce and overlay a visual indication indicative of a target or section currently invalid for shooting.

In some embodiments, in response to receiving the signal, the processor is configured to produce and overlay a visual indication indicative of shooting instructions, to the user. In other embodiments, the output device is configured to display the image, with an overlaid visual indication of at least a target zone in the target. In yet other embodiments, the output device includes a headset, which is configured to play an audible indication of the hit to the user.

In an embodiment, the target includes multiple sections, and the processor is configured to determine, based on the signal, which section among the multiple sections was physically hit by the projectile. In another embodiment, the target assembly includes a controller, which is coupled to the target and is configured to determine which section among the multiple sections was physically hit by the projectile, and to indicate to the processor, using the signal, the section physically hit by the projectile.

In some embodiments, the target assembly includes a first wireless communication device connected to the controller, and the system includes a second wireless communication device connected to the processor, such that the processor and the controller are configured to wirelessly exchange signals with one another using the first and second wireless communication devices. In other embodiments, the processor is configured to detect a hit event by analyzing changes of the signal over time.

There is additionally provided, in accordance with an embodiment of the present invention, a method for enriching visualization of target shooting, the method includes receiving an image, which shows a target and is acquired while a user is physically shooting a projectile at the target. A signal indicative of a physical hit by the projectile is received from a target assembly that includes the target. In response to the signal, a visual indication of the hit is overlaid on the image, and the visual indication is registered with the target. The image with the overlaid visual indication of the hit is displayed to the user.

There is further provided, in accordance with an embodiment of the present invention, a computer software product, the product including a tangible non-transitory computer-readable medium, in which program instructions are stored, which instructions, when read by a processor, cause the processor to: (i) receive an image, which shows a target and is acquired while a user is physically shooting a projectile at the target, (ii) receive, from a target assembly that includes the target, a signal indicative of a physical hit by the projectile, and (iii) in response to the signal, overlay on the image a visual indication of the hit, registered with the target.

The present invention will be more fully understood from the following detailed description of the embodiments thereof, taken together with the drawings in which:

DETAILED DESCRIPTION OF EMBODIMENTS

Overview

Embodiments of the present invention that are described hereinbelow provide methods and systems for improving the present accuracy of target shooting reporting, and methods and systems for enriching the visualization of target shooting using interactive augmented reality (AR) techniques.

In some embodiments, a user conducts a shooting session vis-à-vis a shooting target with the assistance of a visualization system, e.g., in the form of Augmented Reality (AR) goggles described in detail below. In example embodiments, the system comprises AR goggles worn by the user, and a target assembly comprising the target.

In some embodiments, the target assembly comprises the shooting target and an electronic assembly. The shooting target comprises a substrate having first and second patterns made from one or more layers of printed conductive traces, which are disposed on the substrate and are electrically coupled to one another. The first pattern is disposed on a first section of the substrate, also referred to herein as a target zone, and comprises a first conductive ink having a first electrical conductivity. The second pattern is disposed on a second section of the substrate, also referred to herein as a periphery area, and comprises a second conductive ink having a second electrical conductivity, typically different from the first electrical conductivity.

In some embodiments, the visualization system comprises a processor and an output device. The processor is configured to receive from a camera one or more images, e.g., video footage, showing the shooting target. The images are acquired while a user is physically shooting a projectile at the shooting target. The processor is further configured to receive from a wireless communication device coupled to the shooting target a signal indicative of a physical hit by the projectile.

In some embodiments, the processor is configured, in response to receiving the signal, to overlay on the images a visual indication of the projectile hit, registered with the shooting target. In some embodiments, the output device is configured to display the images to the user, with the overlaid visual indication of the projectile hit.

In some embodiments, the AR goggles comprise a camera, a display, a processor and a wireless communication device, all coupled to the goggles. The processor of the goggles receives from the camera images of the target assembly acquired while the user is shooting the target.

In some embodiments, the pattern traces are electrically connected to the electronic assembly, which comprises a controller and the wireless communication device. The target is configured to conduct signals that change in response to a projectile physically hits the traces. The controller is configured to detect a hit event of the target by the projectile and to wirelessly send a signal, indicative of the hit event, to the processor.

In some embodiments, the processor is configured to overlay on the images of the target a visual indication of the hit that is registered with the target. The visual indication may comprise any virtual object, such as a balloon, a bottle, or a drawing of a target. The virtual object may appear solid or flickering, for example, and may have a constant or alternating color, or any other appearance. Various other visual effects are also contemplated.

In an embodiment, the target substrate may contain one or more target zones, wherein each target zone is surrounded by a periphery area. In this embodiment, the controller of the target assembly is configured to detect whether the projectile hits the target zone or the periphery area, and to wirelessly send signals, indicative of the detected hit location, to the processor.

In some embodiments, the processor is configured to overlay on the displayed images of the target virtual objects that are registered with target zones of the target assembly. These virtual objects may be used, for example, for prioritizing the target zones. The virtual objects may appear permanently or for a limited time period and then shift to another target zone.

In some embodiments, the processor is configured to output the shooting results to one or more output devices, such as any haptic device or a headset configured to play voice commands and sounds indicating the shooting results.

In some embodiments, the system may be used by multiple users located at the same site or at different sites. In these embodiments, multiple users may compete with one another in real-time or at different times, based on the final score accomplished by users training according to a certain game plan.

The disclosed techniques provide users with a multi-sensual (e.g., visual, audible, haptic) interactive experience of a target shooting game. The interactive experience includes real-time feedback on the shooting results and flexibility to adjust the game to the level of the player. The disclosed techniques can be used for training users and improving their marksmanship skills, for producing attractive interactive games rich in visual effects, or for any other application involving target shooting.

System Description

Figure 1:
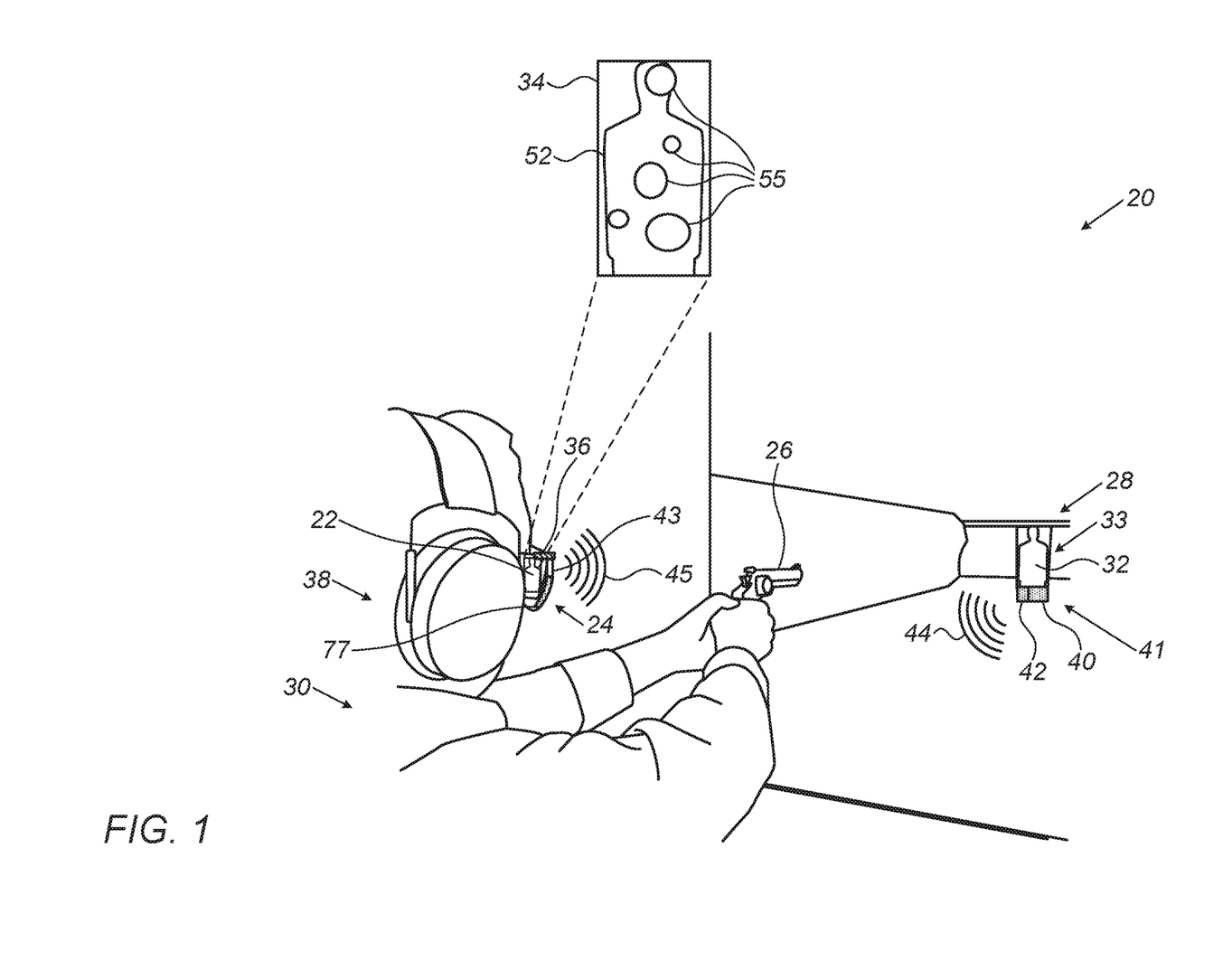
FIG. 1 is a schematic, pictorial illustration of a system for enriched visualization of target shooting, in accordance with an embodiment of the present invention.

FIG. 1 is a schematic, pictorial illustration of a system 20 for enriched visualization of target shooting, in accordance with an embodiment of the present invention. In some embodiments, a user 30 of system 20 aims a weapon, such as a pistol 26, at a target assembly 28 located at a predefined distance from user 30.

Weapon 26 typically comprises a genuine weapon that shoots genuine physical projectiles, e.g., bullets. In an application that trains law-enforcement personnel, for example, the user may use system 20 with his or her own personal weapon. Typically, no adaptation of weapon 26 is required for operating in system 20.

Figure 2A:
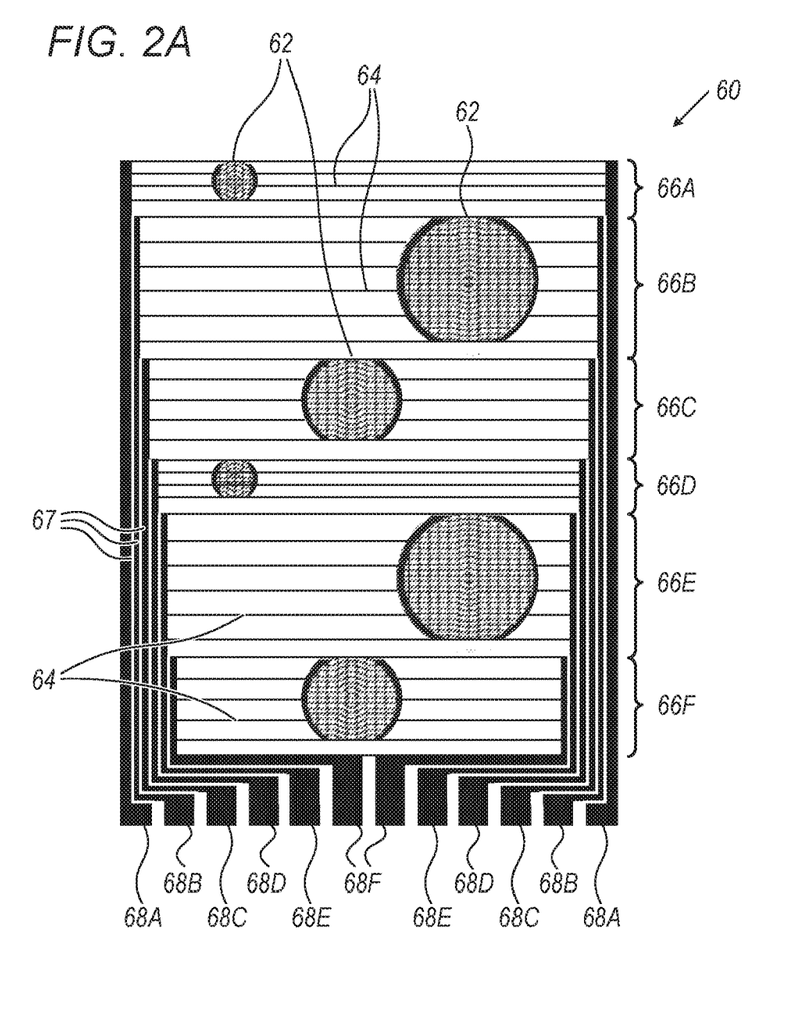
FIGS. 2A and 2B are schematic, pictorial illustrations of shooting targets, in accordance with embodiments of the present invention.
Figure 2B:
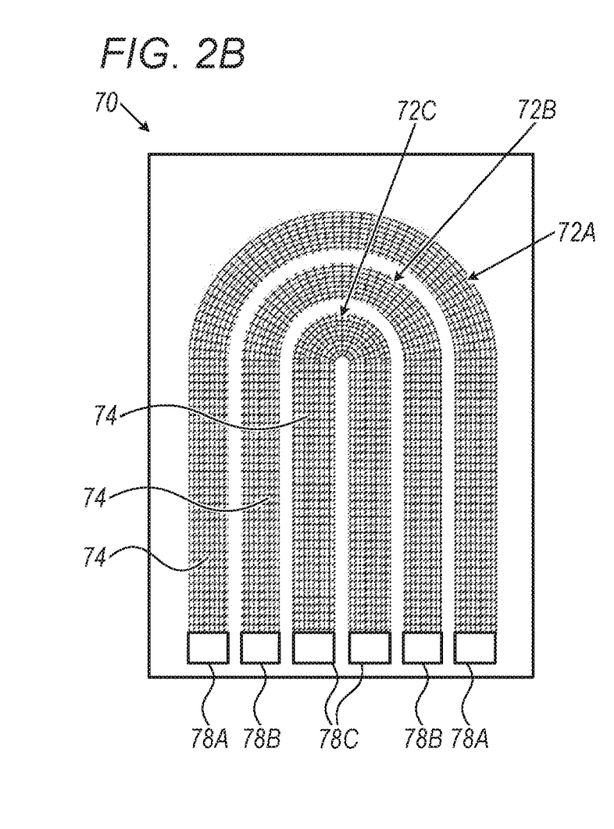

In some embodiments, target assembly 28 comprises a shooting target 33 made from a paper sheet or from any other suitable type of substrate. A pattern 32 is printed on the substrate using one or more layers of traces made from conductive ink or any other suitable product, such as flexible printed circuit board (PCB). Example patterns are shown in FIGS. 2A and 2B below.

In some embodiments, target assembly 28 comprises an electronic assembly 41, which is configured to detect a hit event, e.g., by detecting a significant change of electrical resistance in the printed pattern at the hit location, caused by the projectile penetrating a hole in the substrate. In other embodiments, assembly 41 detects the hit event and location based on other techniques, such as detecting electrical shorts, optical detection, ultrasonic detection or any other suitable technique. In some embodiments, pattern 32 may have one or more sections having different respective sizes and shapes, as will be described, for example, in FIGS. 2A and 2B below.

In some embodiments, electronic assembly 41 is electrically coupled to target 33 and is configured to receive/detect signals from target 33, to analyze the received signals for detecting hit events, and to send hit detection indications to other devices of system 20, such as augmented reality (AR) goggles 24 worn by user 30.

In some embodiments, assembly 41 is powered by a battery or other power source (not shown). User 30 may attach assembly 41 to an interface of target 33, and activate assembly 41 only when he/she wants to start the shooting practice, also referred to herein as "game." Typically, although not necessarily, assembly 41 is attachable to and detachable from target 33, e.g., using one or more suitable connectors or clips.

In some embodiments, electronic assembly 41 comprises a controller 40, which is electrically connected to target 33 and is configured to convert analog signals received from target 33 to sampled digital signals. In some embodiments, controller 40 is further configured to output, based on analyzing the received signals, detected hitting events, including the hit location of each projectile in target 33 as will be described in detail below.

In some embodiments, electronic assembly 41 further comprises a wireless communication device 42, which is configured to exchange information between controller 40 and other devices of system 20, such as AR goggles 24, e.g., using Bluetooth™, Wi-Fi, infrared or any other suitable wireless technology or standard.

In some embodiments, goggles 24 comprise a camera 36, which is configured to acquire a sequence of images of target 33 and its vicinity and a processor 77. In some embodiments, when user 30 shoots a projectile at target 33, processor 77 is configured to receive from camera 36 images of target 33 captured at the time of shooting. Processor 77 additionally receives from controller 40 of target assembly 28 a signal, also referred to herein as a location signal, indicative of the location of a physical hit of target 33 by the projectile.

In some embodiments, in response to receiving the location signal from the target assembly, processor 77 is configured to overlay on the video images of target 33, a visual indication of the hit registered with the target. In some embodiments, device 42 is configured to wirelessly send radio-frequency (RF) signals 44 conveying the location signal, to a wireless communication device 43 coupled to goggles 24.

In some embodiments, device 43 is configured to wirelessly receive RF signals 44 from device 42 and to optionally send RF signals 45 thereto. In some embodiments, before using system 20, user 30 may carry out a pairing process so as to synchronize the wireless communication between devices 42 and 43.

In some embodiments, processor 77 in goggles 24 is configured to estimate the distance between user 30 and target assembly 28, using camera 38 or any other suitable distance measurement technique. In some embodiments, the distance measurement may be carried out by an external device and wirelessly sent to device 42 and stored in processor 77.

In some embodiments, the measured distance may be used to conduct a multi-player shooting game between user 30 and one or more other players located at remote sites. In these embodiments, each player shoots at a similar type of target from a similar distance according to a similar game plan, and the scoring results may be compared during the game or after the game is over, and displayed to all players.

In other embodiments, after attaching assembly 41 to the interface of target 33, user 30 sets the distance between pistol 26 and target 33 using a target transportation system of a shooting range.

In some embodiments, user 30 wears AR goggles 24 for both eye protection and for visualizing the shooting target. In some embodiments, googles 24 comprise a display 22, which is configured to display to user 30 a real-time score of points achieved, and the visual indication of the projectile hit, overlaid on the images of target 33 that is acquired by camera 36 while user 30 shoots each projectile.

Using Augmented Reality Goggles for Enriching the Visualization of Target Shooting Reference is now made to an inset 34 at the top of FIG. 1, which is a magnification of the image displayed by processor 77 to user 30 on display 22 of AR goggles 24. In some embodiments, visual indicators 55 may be overlaid on selected sections in target 33. For example, visual indicators 55 may appear as virtual bottles of glass, each bottle having a different color indicative, for example, of shooting priority or shooting score.

Note that in this example, indicators 55 are displayed regardless of whether there is a hit of the respective target.

In another example, bottles of higher priority and/or higher score may appear flickering on display 22, the flickering may be permanent (e.g., until the bottle is hit by a projectile) or for a predefined period of time, such as for ten seconds. Note that in this example, indicators 55 are displayed as long as the respective target is not hit. In an embodiment, when the respective target is hit by the projectile, the respective indicator 55 disappears, and another type of indicator (not shown) is displayed so as to indicate that the respective target was hit.

For example, indicator 55 may appear as a virtual flickering bottle at a location of a given target, and in response to detecting that the given target is hit, the virtual flickering bottle disappears and another indicator, such as an exploded bottle, is displayed at the location of the given target.

In other embodiments, processor 77 may display only visual indicators indicative of a target hit, without displaying visual indicator 55.

In alternative embodiments, system 20 may apply any suitable display configuration of the shooting target and the hit indication, including but not limited to, a combination of the aforementioned configurations. Furthermore, visual indicators 55 may be stationary or dynamic, e.g., moving across the area of image 52, images, icons, animations or may have any other suitable appearance.

In some embodiments, processor 77 is configured to produce any other suitable types of virtual display, such as but not limited to, fire and/or smoke indicative of target hit by one or more projectiles, a virtual trail indicative of the projectile path, an icon indicative of target hit/terminated or missed, or any other suitable types of virtual display overlaid on image 52 of target 33.

In some embodiments, target assembly 28 may have a limited number of allowed projectile hits. The limitation may be associated with specific sections of target 33, as will be depicted in FIGS. 2A, 2B and 5 below, or with the entire area of pattern 32. In these embodiments, visual indicators 55 may indicate, for example, disabling of one or more sections of target 33.

In other embodiments, in response to accomplishing the required number of projectile hits, processor 77 is configured to output a game-winning indication, for example by displaying on display 22 a suitable animation overlaid on image 52.

Similarly, in response to projectile hits that exceed the allowed number for a specific section of target 33, processor 77 may be configured to output a game-over indication displayed on display 22. The indication may be overlaid on image 52 so as to indicate the location of the disabled section.

In other embodiments, processor 77 may display a text message, such as "game over", "you win," "game lost" or any other type of message.

In some embodiments, user 30 may initiate the shooting game using any suitable interface, for example, by touching a specific button (not shown) of goggles 24. In these embodiments, the shooting game may be time-limited. In some embodiments, processor 77 is configured to display an indication of the remaining time, to output time-dependent visual indicators overlaid on image 52, to display a timestamp showing the remaining time of the game, and to terminate the game when the predefined time of the game is completed.

In some embodiments, system 20 may comprise, in addition to, or instead of goggles 24, a mobile phone, a transparent display positioned in front of the head of user 30, contact lenses attached to the eyes of user 30, or any other suitable device configured to display virtual or real objects overlaid on target 33, or on an image thereof (e.g., image 52,) using any suitable technique of augmented reality. Any such device is considered a type of output device in the present context.

In some embodiments, system 20 further comprises a headset 38, which is configured to protect the ears of user 30 from the noise associated with the shooting. In some embodiments, headset 38 is further configured to play sounds to user 30 in response to hitting and/or missing a specific section of target 33. In some embodiments, headset 38 may comprise a wireless communication device, similar to the aforementioned device 43, which is paired with devices 42 and 43, and configured to exchange wireless signals therewith.

For example, based on a visual output from processor 77, display 22 displays to user 30 one or more glass bottles in selected sections of target 33. In some embodiments, in response to receiving from target assembly 28 a location signal indicative of a physical hit of the selected section (on which the bottle is displayed) by the projectile, processor 77 is configured to produce a bottle-explosion sound output wirelessly sent by device 43 and played to user 30 by headset 38.

In some embodiments, at least some of the aforementioned features of display 22 may be applicable to headset 38. For example, on-off sounds may be used instead of flickering displays, different volume and frequency, as well as voice commands may be used for other purposes described above.

In alternative embodiments, user 30 may wear any other suitable headgear, e.g., devices having stereoscopic, three-dimensional visual displays and sound equipment, and configured to exchange wireless signals with device 42.

In some embodiments, after user 30 attaches electronic assembly 41 to target 33 and pairing is carried out between devices 42 and 43, controller 40 identifies the type of target, and sends the target type to processor 77.

In some embodiments, processor 77 is configured to display on display 22 optional games, based on the type of target, the type of game (e.g., time-based, or target-hitting-based) and the experience-level of user 30 (e.g., beginner, advanced, or expert.) After user 30 selects the game, using any suitable interface, processor 77 outputs a display and/or voice instructions of the game. The instructions may comprise a countdown of a predefined number of seconds for starting the game.

In some embodiments, processor 77 outputs to user 30 shooting instructions after a predefined period of time, e.g., ten second after starting the game. For example, target 33 may comprise a physical drawing of a green balloon, whereas processor 77 is configured to display a virtual red shooting object, overlaid on and registered with the green balloon. The object may be shaped as a target, as a crosshair, or in any other suitable way. The appearance of the red shooting object serves as a shooting instruction for user 30.

In some embodiments, after a projectile shot by user 30 hits the red shooting object, processor 77 displays the object flickering and plays a sound of applause in headset 38. Processor 77 further displays, on display 22, the number of points gained in this hit, and may optionally play the verbal status of the gained points in headset 38.

In some embodiments, after hitting the target a predefined number of times (e.g., five times), processor 77, which receives from controller 40 signals indicative of the hits, replaces the red object with a red icon having an "X" shape, so as to instruct user 30 that this target is disabled.

In other embodiments, the pattern of target 33 may comprise multiple balloons, and processor 77 may display the currently-valid shooting object a few seconds on one balloon and then shift the currently-valid shooting object to another balloon for another few seconds.

In alternative embodiments, the shooting instructions may vary based on the type of target, the game level or any other parameter, and may comprise static and/or dynamic appearance of the virtual objects overlaid on image 52 of target 33.

The different elements of system 20 and its components, e.g., assembly 41 and goggles 24, may be implemented using suitable hardware, such as using discrete components, one or more Application-Specific Integrated Circuits (ASICs) and/or one or more Field-Programmable Gate Arrays (FPGAs), using software, or using a combination of hardware and software elements. Typically, processor 77 and controller 40 each comprises a general-purpose processor, which is programmed in software to carry out the functions described herein. The software may be downloaded to any of the processors in electronic form, over a network, for example, or it may, alternatively or additionally, be provided and/or stored on non-transitory tangible media, such as magnetic, optical, or electronic memory.

The particular configuration of system 20 of FIG. 1 is shown by way of example, in order to illustrate certain problems that are addressed by embodiments of the present invention and to demonstrate the application of these embodiments in enhancing the performance of such a system. Embodiments of the present invention, however, are by no means limited to this specific sort of example system, and the principles described herein may similarly be applied in any other suitable system configuration.

Shooting Targets that Output Signals Indicative of the Hit Location of a Physical Projectile FIG. 2A is a schematic, pictorial illustration of a shooting target 60, in accordance with an embodiment of the present invention. Shooting target 60 may serve, for example, as shooting target 33 of FIG. 1 above. In some embodiments, target 60 comprises multiple sections, such as depicted in the figure as six sections 66A, 66B, 66C, 66D, 66E and 66F.

In some embodiments, each section comprises one or more target zones 62 comprising a dense grid of electrically-conductive circuit traces. (The term "electrically-conductive circuit traces" is referred to below simply as "traces" for brevity.) The shape of a given zone 62 may be round as shown in the example of FIG. 2A, or may have any other suitable shape. Each zone 62 is electrically connected to traces 64 disposed in the periphery area of the respective section.

In the example of FIG. 2A traces 64 are laid out horizontally, but may alternatively be arranged in any other suitable configuration, such as but not limited to a grid of horizontal and vertical traces, vertical traces only, or a diagonal grid.

In some embodiments, target 60 comprises electrical connectors 68, configured to connect between target 60 and electronic assembly 41 shown in FIG. 1 above. In some embodiments, target 60 comprises traces 67 located at the edge of target 60 and configured to electrically connect between traces 64 and electrical connectors 68.

In the example of FIG. 2A, connectors 68 comprises six pairs of connectors 68A-68F associated with sections 66A-66F, respectively. In an embodiment, one connector of each pair is connected to a ground potential and the other connector is coupled to a respective current source that drives a predefined current level to the traces. Electronic assembly 41 measures the resulting voltage, or any other suitable electrical parameter described below, between the pair of connectors, as will be described in detail in FIG. 3 below.

Note that the voltage measured in a given section depends on whether or not a hit occurred in this section. In case of a hit, the measured voltage depends on the hit location within the given section. Since the density of traces differs between the target zone and the periphery, different voltage levels are typically measured when the hit occurred at target zone 62 and at the respective periphery area of the given section.

For example, a projectile hit occurring at target zone 62 of section 66B may impact a certain percentage of the traces of target zone 62, whereas a projectile that hits the periphery area of section 66B, may impact a significantly larger number of traces, e.g., larger by an order of magnitude. Therefore, the change in voltage (relative to a baseline "no hit" voltage) will be much smaller for a hit in zone 62 than for a hit in the periphery.

Typically, the density of traces in the target zone and in the periphery (specified, for example, in units of traces per inch) is derived from the caliber of the projectiles used for shooting. In this manner, the percentage of traces hit by a projectile (and the resulting voltage change) can be controlled.

In some embodiments, controller 40 in target assembly 28 is configured to detect a hit in a given section based on the voltage level measured on connector pair 68 of this section, and to distinguish whether the hit occurred at the target zone or periphery area of the respective section. In these embodiments, controller 40 is configured to determine the location in which the projectile physically hits target 60.

The layout of target 60 is shown by way of example, in order to illustrate certain features, such as detecting a hit location of a projectile in a multi-sectional non-uniform target, of embodiments of the present invention. Embodiments of the present invention, however, are by no means limited to this specific layout, and the principles described herein may similarly be applied to other suitable types of shooting targets.

FIG. 2B is a schematic, pictorial illustration of a shooting target 70, in accordance with another embodiment of the present invention. Shooting target 70 may serve, for example, as shooting target 33 of FIG. 1 above. In some embodiments, target 70 comprises three sections 72A, 72B and 72C. Each of these sections is shaped as an arc, whereas section 72A is the outer arc and section 72C is the inner arc. Each section 72A-72C comprises horizontal and vertical traces 74 arranged, for example, in a grid of conductive traces, and is electrically coupled to electronic assembly 41 via respective electrical connectors 78A-78C.

As described in FIG. 2A above, the electrical connectors, e.g., connectors 78A-78C, are arranged in pairs, one connector of each pair connects to a ground potential, and the other connector of the pair is coupled to the current source and used for measuring voltage by electronic assembly 41. Additionally or alternatively, electronic assembly 41 is configured to measure one or more other electrical parameters, such as but not limited to a change in resistance or current flow.

Note that in this example embodiment, sections 72A-72C in their entirety serve as target zones. Unlike target 60 of FIG. 2A, in target 70 of FIG. 2B the target zones are connected directly to connectors 78 without any periphery area. In some embodiments, controller 40 detects a change in the voltage measured on a connector 78, which change is indicative of a physical hit of the respective zone (section in the example of FIG. 2B) by a projectile at the respective target zone.

The configuration of target 70 is depicted purely by way of example, in other embodiments, target 70 may have any other suitable shape, such as round or triangular, and may have a continuous shape like sections 72A-72C or multiple separated segments coupled to one another by traces, similar to traces 64 of FIG. 2A above. In yet other embodiments, target 70 may comprise any suitable combination of sections of any type on the same target substrate, such as section 72A of FIG. 2B, with one or more target zones, such as zones 62 shown in FIG. 2A above.

Figure 3:
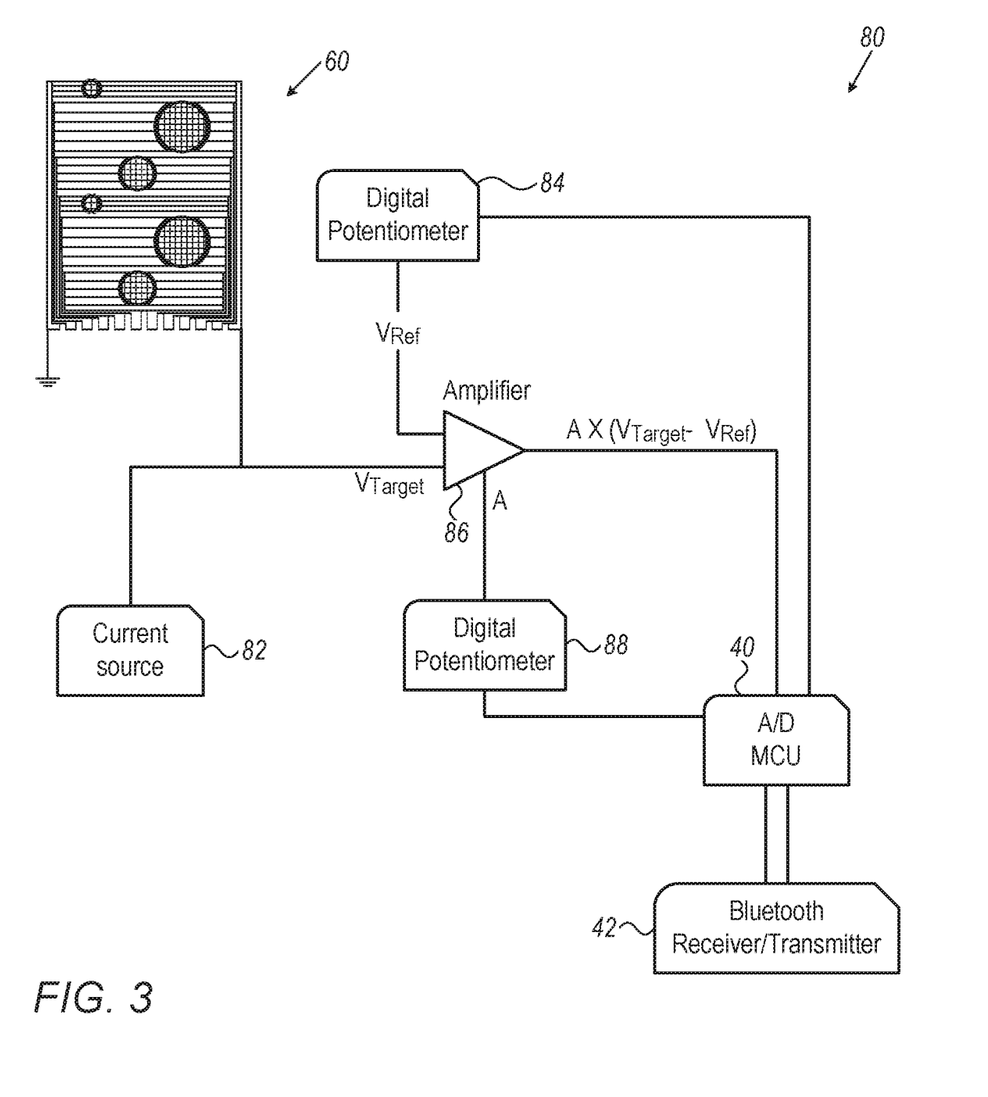
FIG. 3 is a block diagram that schematically illustrates a hit detection circuit of a shooting target assembly, in accordance with an embodiment of the present invention.

FIG. 3 is a block diagram that schematically illustrates a hit detection circuit (HDC) 80 of shooting target 60, in accordance with an embodiment of the present invention. In some embodiments, each of the sections of target 60 connects to a dedicated respective HDC, such as HDC 80. HDC 80 is typically implemented as part of electronic assembly 41 coupled to target 60. HDC 80 monitors the voltage level across the target section to which it connects. In some embodiments, HDC 80 comprises a current source 82 that flows a constant current via a certain target section 66 of target 60.

In some embodiments, HDC 80 comprises a differential amplifier 86, which is configured to receive a reference voltage $V_{Ref}$. In some embodiments, HDC 80 further comprises a digital potentiometer 84 configured to control the level and stability of the reference voltage supplied to differential amplifier 86.

In some embodiments, differential amplifier 86 receives from connectors 68 of target 60, voltages referred to herein as $V_{Target}$. The differential amplifier outputs a voltage level that is proportional to the voltage difference between its inputs.

In some embodiments, HDC 80 comprises another digital potentiometer 88, which is configured to control the amplification gain "A" of differential amplifier 86. The voltage level output by differential amplifier 86 is denoted $\Delta$ ("delta") and is given by $\Delta = A \cdot (V_{Target} - V_{Ref})$. In alternative embodiments, HDC 80 is configured to operate at a constant amplification gain of differential amplifier 86. In this configuration potentiometer 88 is omitted.

In some embodiments, each section 66, also referred to herein as a "channel," receives a specific (e.g., substantially similar) current from current source 82 and outputs a respective $V_{Target}$ to differential amplifier 86. In these embodiments, each channel comprises a separate set of current source 82, differential amplifier 86, and optionally digital potentiometer 88.

The different elements of HDC 80 are controlled by controller 40 (denoted A/D MCU in this figure). In alternative embodiments, HDC 80 may comprise any other suitable configuration, such as having the current source common to multiple channels, whereas each channel having a separate differential amplifier. Controller 40 and wireless device 42 is also typically common to all channels, i.e., all HDCs 80 in assembly 41.

In some embodiments, controller 40 is configured to determine the type of target being used (e.g., target 60 or target 70). In an example embodiment, the type of target is encoded physically on the target (e.g., a certain index value on target 60, and a different index value on target 70). Controller 40 reads the type of target from the target it is connected to, and the controller code adapts to the corresponding type of target. In alternative embodiments, controller 40 may identify the type of target being used in any other suitable way.

In some embodiments, processor 77 receives from controller 40 a signal indicative of the type of target being used, and is configured to display the type of target on display 22, and optionally request an acknowledgement from user 30.

In some embodiments, in response to detecting a hit, device 42 sends the hit location to processor 77 of goggles 24 as described in FIG. 1 above.

Figure 4:
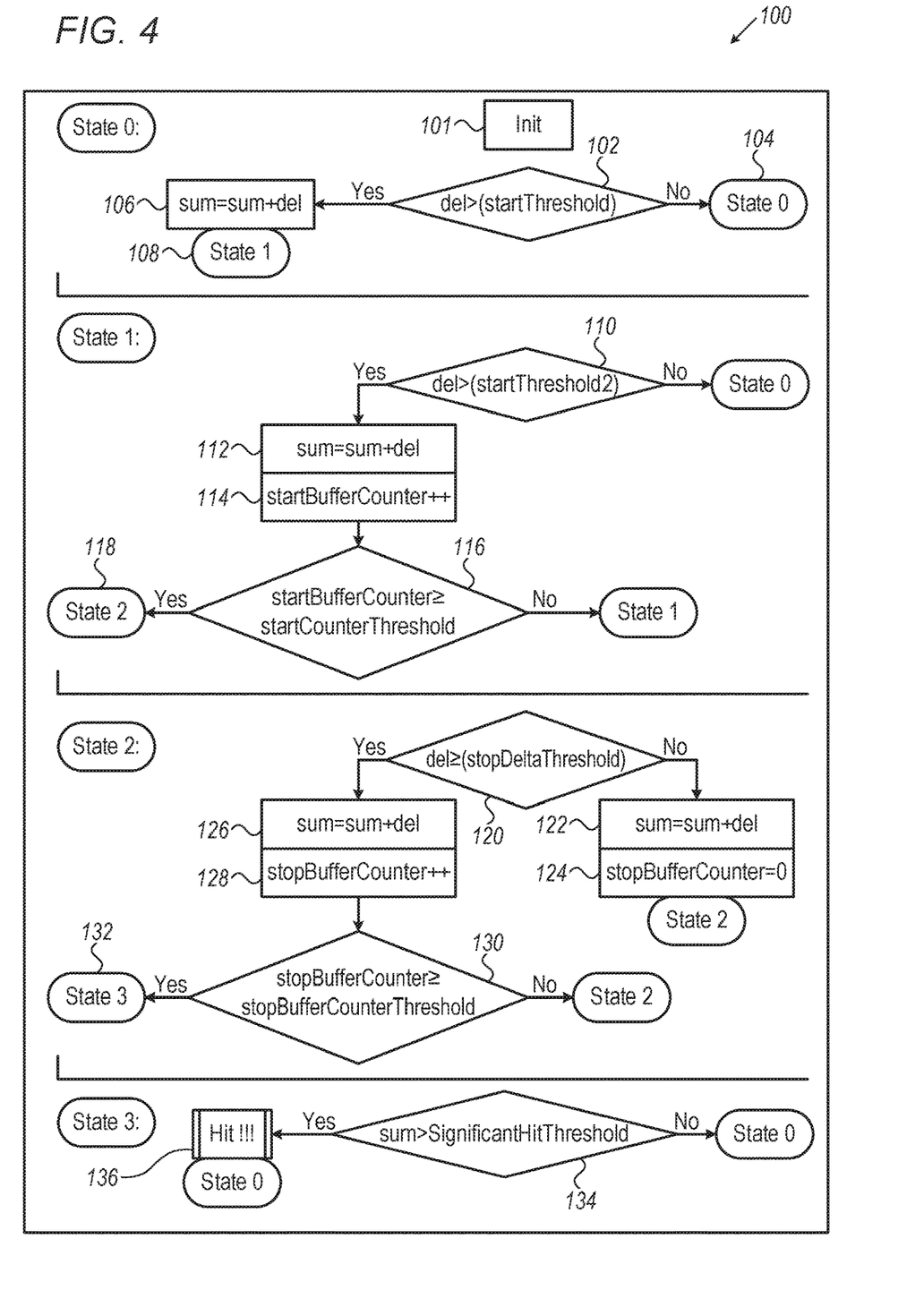
FIG. 4 is a state diagram that schematically illustrates a method for detecting a projectile hit in a shooting target, in accordance with an embodiment of the present invention.

FIG. 4 is a state diagram 100 that schematically illustrates a method for detecting a projectile hit in shooting target 60, in accordance with an embodiment of the present invention. State machine 100 is carried out by controller 40 in HDC 80. In some embodiments, the state machine has four states described herein, denoted "State 0"-"State 3". Alternatively, any other suitable number of states and any other suitable logic can be used for the state machine.

The method begins with controller 40 initializing a state variable to state 0, at an initialization ("init") step 101. Other variables are initialized as sum=0, startBuffercounter=0, and stopBuffercounter=0. The variable "sum" is used for accumulating the overall voltage change during a hit event. The counter variables are used to recognize the start and end of a hit event, respectively.

As described in FIG. 3 above, controller 40 receives from differential amplifier 86 the delta voltage at the differential amplifier output. Controller 40 digitizes (samples) this voltage over time. A variable holding the most recently digitized delta voltage sample is referred to herein as "del".

At a comparison step 102, controller 40 compares between delta and a first threshold, referred to herein as a StartThreshold. If the delta is lower than the StartThreshold, the state machine remains in state 0, which means no changes detected in the respective channel, as shown at a state 0 step 104. In some embodiments, when the state machine is looped back to state 0, the method loops back to init step 101.

If the delta is higher than the StartThreshold, the method proceeds to an integration step 106, at which processor 77 increases the variable sum by the value of del.

At a state transfer step 108, the state machine moves to state 1. In some embodiments, state 1 begins at a comparison step 110 controller 40 compares between del and a second threshold, referred to herein as a StartThreshold2, higher than StartThreshold. If the value of del is lower than StartThreshold2, the method loops back to state 0 of the state machine, which means the detected delta level is not sufficiently high and therefore the channel is considered "quiet," e.g., a shooting event has not started yet.

If at comparison step 110, the level of delta is higher than StartThreshold2, controller 40 increases del into the sum variable, at an integration step 112, and at a counting step 114, controller 40 increases the startBuffercounter variable.

At a comparison step 116, controller 40 checks whether startBuffercounter variable exceeds a predefined threshold, referred to herein as a StartCounterThreshold. If startBuffercounter variable is still smaller than StartCounterThreshold, the state machine remains in state 1 and the method loops back to comparison step 110.

If startBuffercounter variable is larger than StartCounterThreshold, the state machine moves to state 2, at a state 2 step 118. Note that moving from state 1 to state 2 indicates starting an event of a potential hit. The event continues as long as del remains higher than StartThreshold2 and consistently repeats with every "delta" received from differential amplifier 86.

At some point in time, the delta between the voltage received from the target ($V_{Target}$) and the reference voltage ($V_{Ref}$) decreases, which is indicative of ending the event. At this stage the method moves from state 2 to state 3 of the state machine as will be described below.

At a comparison step 120, controller 40 compares between del and a third threshold, referred to herein as a StopDeltaThreshold, lower than StartThreshold2. If del is smaller than StopDeltaThreshold, controller 40 increases del into the sum variable, at an integration step 122. In some embodiments, controller 40 further initializes the stopBuffercounter variable to zero, at a buffer reset step 124, and loops back to comparison step 120 of state 2. In other words, the state machine remains in state 2.

If at comparison step 120, del is higher than StopDeltaThreshold, controller 40 increases del into the variable sum, at an integration step 126. At a counting step 128, controller 40 updates the stopBuffercounter variable by one.

At a comparison step 130, controller 40 checks whether the stopBuffercounter variable is above a predefined threshold, referred to herein as a StopBufferCounterThreshold. If the value of the stopBuffercounter variable is smaller than the StopBufferCounterThreshold, the method loops back to comparison step 120 and the state machine remains in state 2. Otherwise, the state machine moves to state 3, at a state 3 step 132. Moving from state 2 to state 3 indicates that the current event has ended.

At a comparison step 134, controller 40 compares between the sum variable that accumulated the del values and a predefined threshold, referred to herein as a significantHitThreshold.

If the sum variable is smaller than significantHitThreshold, the method loops back to state 0 of the state machine, which means, no projectile hit detected in target 60. If the sum variable is larger than significantHitThreshold, controller 40 outputs a target hit indication, at a hit reporting step 136. In some embodiments, the target hit indication comprises the value of the variable sum and the hit location in target 60 and is sent, via device 42, to goggles 24, and displayed on display 22.

Subsequently, the method loops back to state 0 of the state machine so as to initialize the state machine for detecting a subsequent projectile hitting target 60.

Figure 5:
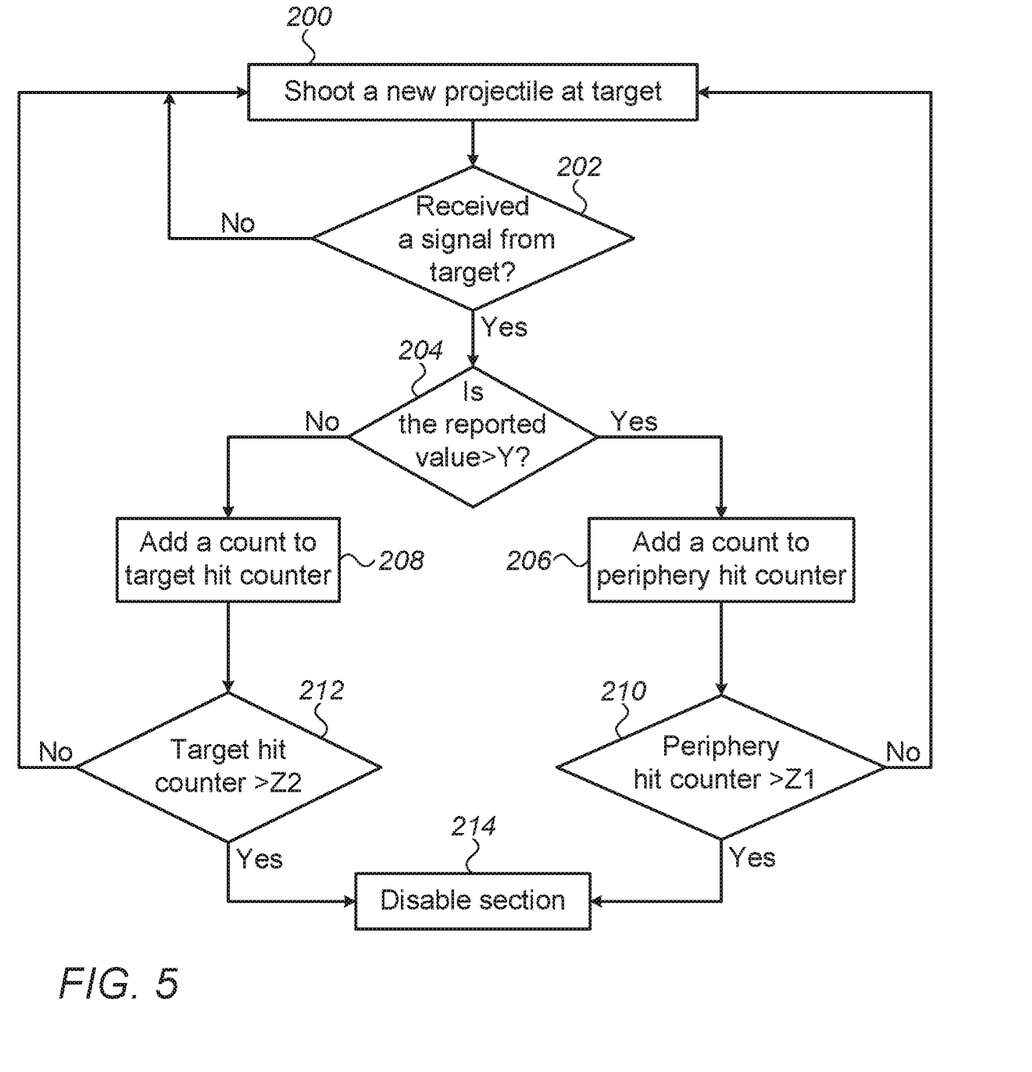
FIG. 5 is a flow chart that schematically illustrates a method for managing availability of sections of a shooting target, in accordance with an embodiment of the present invention.

FIG. 5 is a flow chart that schematically illustrates a method for managing availability of sections of shooting target 60, in accordance with an embodiment of the present invention. The method of FIG. 5 is carried out by processor 77.

The method begins with the user shooting a projectile at target 60, at a projectile shooting step 200. At a hit detection step 202, processor 77 checks whether wireless communication device 42 sent a signal indicating that the projectile physically hit target 60. Controller 40 of target assembly 28 may decide to send a signal, for example, using the method described in FIG. 4 above or using any other suitable method. If no signal has been received from device 42, the method loops back to step 200 for shooting a new projectile at target 60.

If a hit indication has been received from device 42, processor 77 checks, at a comparison step 204, whether the value of the overall voltage change received from device 42 exceeds a predefined value Y. In an embodiment, an overall voltage change larger than the value of Y indicates that the projectile hit the periphery area, and a value of overall voltage change smaller the value of Y indicates that the projectile hits target zone 62.

The following steps of the method describe operations in a specific section, but are applicable for all of the sections, as well as for the entire area of target 60.

In some embodiments, processor 77 is configured to hold for each section a counter variable for each target zone 62, referred to herein as a target-hit-counter, and a counter variable for the periphery area, referred to herein as a periphery-hit-counter. At the beginning of the game, processor 77 initializes these counters as sum=0.

In some embodiments, processor 77 further holds one or more thresholds used for limiting the number of hits allowed for each of the periphery and target zones of each sections, as will be described in detail below.

If the overall voltage change exceeds the value of Y, processor 77 receives a signal from device 42 of target assembly 28, of FIG. 1 above, and updates the respective periphery-hit-counter by one, at a periphery counting step 206. Alternatively, based on a signal received from target assembly 28, if the value of the overall voltage change is smaller than Y, processor 77 updates a target-hit-counter by one, at a target counting step 208.

As mentioned above, processor 77 limits the number of hits allowed for each of the periphery and target zones of each sections. In some embodiments, processor 77 holds a threshold denoted Z1 for the periphery-hit-counter described at step 206 above, and a threshold denoted Z2 for the target-hit-counter described in step 208.

At a comparison step 210, after increasing the periphery-hit-counter by one count at step 206, processor 77 compares between the updated periphery-hit-counter and threshold Z1. If the value of the periphery-hit-counter is smaller than Z1, the periphery area is still enabled for shooting and the method loops back to shoot a subsequent projectile at step 200. If the value of the periphery-hit-counter is larger than Z1, processor 77 disables the respective section, at a section disabling step 214.

For example, section 66B comprises six traces 64, assuming the value of Z1 is 2 and an average number of 1.5 traces 64 are affected in a single physical hit, then after three hits, almost all traces 64 are affected, therefore, section 66B is disabled at step 214.

In this example, processor 77 is configured to produce and overlay a visual indication indicative of section 66B currently invalid for shooting. Moreover, in another section (e.g., section 66B) of target 60 in which the value of the periphery-hit-counter is smaller than Z1, processor 77 is configured to produce and overlay a visual indication indicative of section 66E currently valid for shooting.

In other embodiments, in case all zones 62 and periphery area of all sections 66A-66F exceed the allowed number of hits, processor 77 is configured to overlay a visual indication indicative of target 60 invalid for shooting.

As described in FIG. 2B above, electronic assembly 41 is configured to measure one or more other electrical parameters indicative of hit detection, such as but not limited to a change in resistance or current flow.

Similarly for target zone 62, if the value of the target-hit-counter is smaller than Z2, target zone 62 is still enabled for shooting and the method loops back to shoot a new projectile at step 200. If the value of the target-hit-counter is larger than Z2, processor 77 disables the respective section, at a section disabling step 214.

In the example of section 66B, target zone 62 has a large area and contains a dense grid of traces, therefore the value of Z2 may be set larger than the value of Z1, e.g., Z2=5 counts. Step 214 concludes the method of FIG. 5.

Figure 6:
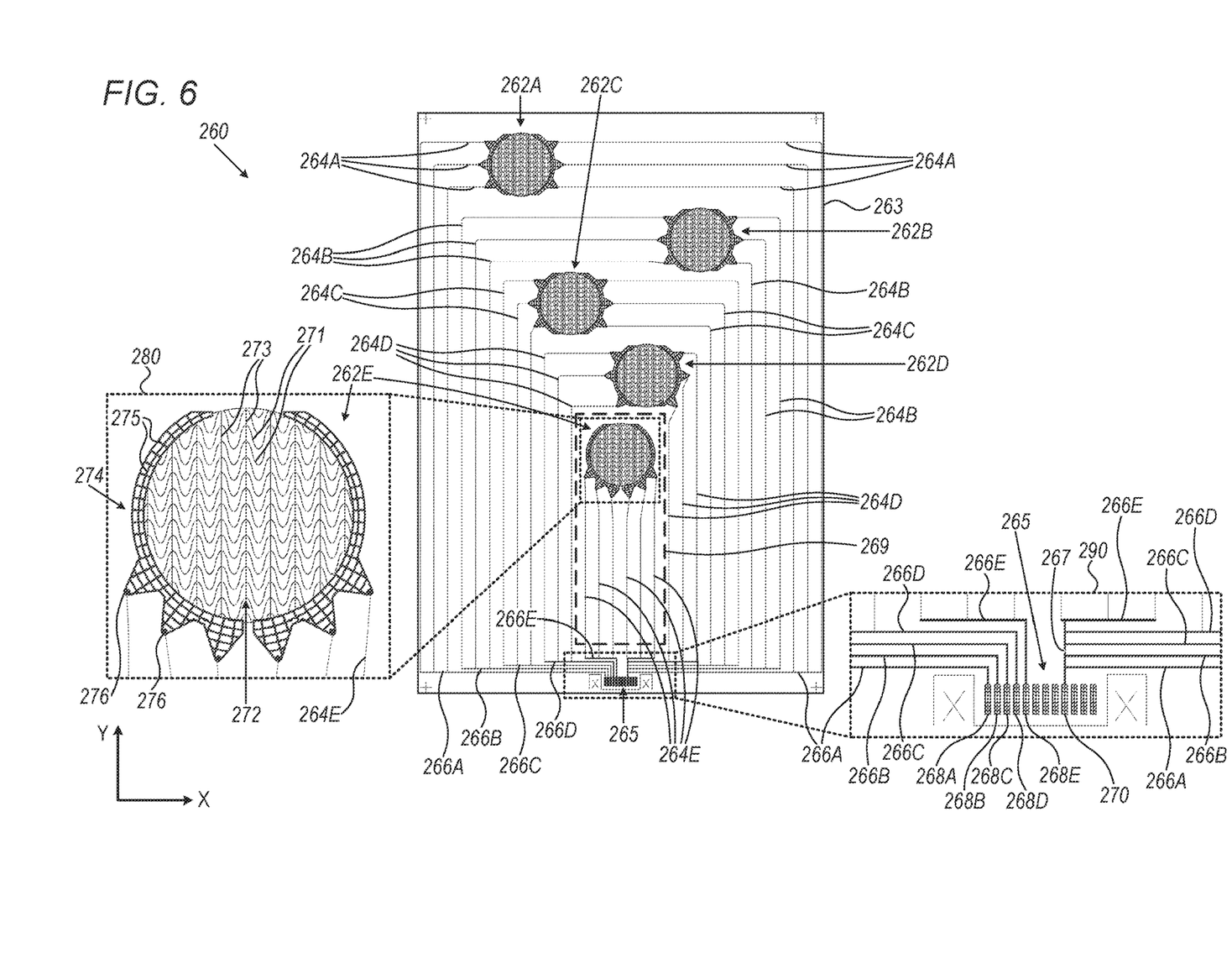
FIG. 6 is a schematic, pictorial illustration of a shooting target, in accordance with another embodiment of the present invention.

Shooting Target Having Multiple Conductive Inks of Different Electrical Conductivities FIG. 6 is a schematic, pictorial illustration of a shooting target 260, in accordance with another embodiment of the present invention. Shooting target 260 may serve, for example, as shooting target 33 of FIG. 1 above. In some embodiments, shooting target 260 comprises a substrate 263 having multiple patterns disposed thereon.

In some embodiments, shooting target 260 comprises one or more target zones, in the present example five target zones 262A, 262B, 262C, 262D and 262E, each of which comprising a grid of electrically-conductive circuit traces, also referred to herein as "traces" for brevity.

In an example embodiment shown in FIG. 6, all target zones are similar, but in other embodiments, at least one of the target zones may have different attributes, such as a different size, shape, layout and materials as will be described below.

Reference is now made to an inset 280 showing a detailed layout of target zone 262E.

In some embodiments, target zone 262E comprises a target pattern 272 having multiple vertical linear traces 273 oriented along Y-axis, and wavy traces 271 oriented along X-axis and laid out in a high spatial density. For example, traces 271 may have, each, a width between 100 μm and 500 μm, or any other suitable width, and a spacing between two adjacent traces 271 may be between 500 μm and 4 mm or any other suitable spacing. The aforementioned layout and dimensions are provided by way of example, and in other embodiments, target pattern 272 may have any other suitable layout of traces having any other suitable dimensions. Note that, due to the wavy shape, traces 271 are interleaved along at least one of X and Y axes so that a projectile that hits target pattern 272 may disconnect at least one, and more likely, two or more of traces 271.

In some embodiments, target zone 262E may comprise an interface pattern 274 made from a grid having a crisscross or any other suitable layout of traces 275, each of which having any suitable width and spacing between two adjacent traces 275.

In some embodiments, target zone 262E may comprises dots 276, configured to electrically connect between traces 275 of interface pattern 274 and electrical traces 264E, which are not part of target zone 262E and will be described in detail below.

In some embodiments, at least some of the traces and dots of target zone 262E may comprise one or more types of electrically-conductive ink made from platinum, or graphene, or graphite, or carbon having an allotrope different than graphene or graphite, or any suitable alloy thereof. The alloying elements of shooting target 260 are described in detail below. Note that the above list is provided by way of example and in other embodiments, at least some of the target zones of shooting target 260, may comprise any other suitable element or an alloy of elements.

Reference is now made back to FIG. 6. In some embodiments, shooting target 260 comprises multiple sections, such as a shooting section 269 that comprises one or more target zones, such as target zone 262E described above, and traces 264E. The shape of target zone 262E may be round as shown in the example of FIG. 6, or may have any other suitable shape. Each of the target zones shown in FIG. 6, is electrically connected to respective electrical traces. In the present example, target zones 262A, 262B, 262C, 262D and 262E, are electrically connected to electrical traces 264A, 264B, 264C, 264D and 264E, respectively.

In some embodiments, the electrical traces are disposed at the periphery area of the respective shooting section. For example, in shooting section 269, electrical traces 264E are disposed at the periphery area, out of the area of target zone 262E. In some embodiments, target 260 comprises horizontal electrical traces 266A, 266B, 266C, 266D, and 266E, which are electrically connected to electrical traces 264A, 264B, 264C, 264D, and 264E.

In some embodiments, electrical traces 264A-264E are thinner than electrical traces 266A-266E and may be produced in the same process step or in different process steps. In alternative embodiments, electrical traces 264A-264E and 266A-266E are all similar and are formed in a single process step.

Reference is now made to an inset 290. In some embodiments, shooting target 260 comprises an electrical connecting assembly 265, also referred to herein as "assembly 265" for brevity. Assembly 265 is configured to connect between the aforementioned traces of target 260, and electronic assembly 41 shown in FIG. 1 above.

In some embodiments, assembly 265 comprises electrical connectors 268A, 268B, 268C, 268D, and 268E, which are electrically coupled to electrical traces 266A, 266B, 266C, 266D, and 266E, respectively. As shown in inset 290, electrical traces 266A-266E are coupled, at each side of assembly 265, to multiple (e.g., three) traces 264A-264E. For example, each of electrical traces 266A is coupled to three electrical traces 264A. In other words, two traces 266A are connected to and are configured to exchange electrical current with six traces 264A. Therefore, as described above, traces 266A may have a larger width and/or comprise a suitable ink having higher conductivity compared to that of traces 264A.

In some embodiments, traces 266A-266E that are located at a first side of assembly 265, referred to herein as a left side, are coupled directly to electrical connectors 268A-268E, and traces 266A-266E that are located at a second side of assembly 265, referred to herein as a right side, are all coupled to a common trace 267, which is electrically coupled to a common electrical connector 270.

In this configuration, the target zones and respective shooting sections of shooting target 260 are electrically coupled to electronic assembly 41 via five respective pairs of electrical connectors. Each pair comprises one connector from among electrical connectors 268A-268E, and electrical connector 270, which is common to all shooting sections.

In some embodiments, one connector of each pair may be connected to a ground potential and the other connector may be coupled to the current source of electronic assembly 41, which drives the predefined current level to the traces described above.

Reference is now made back to the complete layout of shooting target 260 shown in FIG. 6. In some embodiments, a current source of controller 40 or of any other suitable control circuitry of electronic assembly 41, is configured to flow the electrical current, e.g., a direct current (DC) or an alternating current (AC), through each of the sections, and controller 40 is configured to measure the resulting voltage between the pair of connectors. For example, in shooting section 269, controller 40 is configured to flow a DC in a clockwise direction, from connector 268E to electrical connector 270, via traces 266E and 264E, target zone 262E and common trace 267, and to measure the resulting voltage between electrical connectors 268E and 270. In alternative embodiments, controller 40 is configured to flow the DC in a counterclockwise direction, or to flow an AC in both directions. In other embodiments, controller 40 of electronic assembly 41 is configured to measure one or more other electrical parameters indicative of hit detection, such as but not limited to a change in resistance or current flow.

In the example embodiment of FIG. 6, assembly 265 and traces 266A-266E are laid out at the lower edge of shooting target 260. In other embodiments, assembly 265 may be laid out at any other suitable location of shooting target 260, or even external to shooting target 260. In such embodiments, assembly 265 may be electrically coupled to shooting target 260 via leads or wires or any other suitable conductors and/or electronic or electrical assemblies. The traces of shooting target 260, may have any suitable shape for connecting between the target zones and assembly 265.

In the example configuration shown in FIG. 6, traces 264A may be arranged in a flipped "U" shape connecting between target zone 262A and traces 266A. In this configuration, traces 264E may be parallel to Y-axis and traces 266A-266E may be parallel to X-axis. In alternative embodiments, the traces connecting between the target zones and assembly 265 may be arranged in any other suitable configuration as depicted, for example, in FIGS. 2A and 2B above.

In some embodiments, shooting section 269, and any other shooting section of shooting target 260, constitutes an electrical circuit comprising multiple resistors laid out in a parallel and/or serial configuration. In such embodiments, a projectile hit may disconnect at least one of the aforementioned traces, which may result in a change of one or more electrical parameters, such as voltage, resistance and current flow, measured by electronic assembly 41. As shown in FIGS. 2A, 2B, and 6, each of respective shooting target 60, 70 and 260 has different patterns for the target zone and periphery area. Thus, a change in one of the aforementioned electrical parameters is indicative of whether the projectile hits the target zone or the periphery area.

In some embodiments, a shooting target, other than shooting target 260, may comprise two patterns made from the same type of ink. In a first configuration, the periphery area may comprise a narrow trace having an exemplary width of 200 µm, and therefore a high electrical resistance, e.g., in an order of tens of kilo-ohms. In this configuration, a projectile hit in the narrow trace may cause a larger change in the electrical parameters, compared to a projectile hit in the target zone. The narrow trace increases the overall resistance of the respective shooting section. This reduces the detection reliability of system 20 because the ability of electronic assembly 41 to detect small changes in the electrical parameters reduces compared to a wider trace. Moreover, a periphery area having a single narrow trace may result in a low durability of the target shooting. For example, a single projectile hit may disconnect the respective shooting section from electronic assembly 41, and may destroy the entire shooting target.

In a second configuration, the periphery area may comprise a wide trace having an exemplary width of 600 μm, and therefore a low electrical resistance, e.g., in an order of a single-digit kilo-ohms. In this configuration, a first projectile hit in the wide trace may cause smaller (or sufficiently small) change in the electrical parameters, relative to a projectile hit in the target zone, and therefore, may have small or no effect on the detection sensitivity. However, a second hit in the wide trace may result, as described in the first configuration, in reduced sensitivity, and in case of a complete disconnection of the trace, may destroy the entire shooting target. As shown in FIGS. 2A and 2B, the periphery area may comprise multiple traces having a width limited by the available real estate of the shooting target.

In some embodiments, shooting target 260 is designed to maintain high sensitivity and durability by patterning in the periphery area of the shooting section, multiple traces made from a low-resistance ink and having a small width of about 200 μm or less, as will be described in detail below. Note that when the resistance of the periphery traces is smaller than the resistance of the target zone, the overall conductivity, and therefore also the detection sensitivity of the respective shooting section, increases.

In such embodiments, the low-resistance ink allows patterning multiple narrow traces, such as traces 264E, so that a shooting section (e.g., shooting section 269) may have electrical resistivity of a single-digit kilo-ohms. Moreover, shooting section 269 can withstand at least one trace 264E being disconnected without losing functionality, and therefore also improve the durability of shooting section 269. These embodiments are applicable for all shooting sections of shooting target 260.

In some embodiments, at least some of traces 264A-264E and 266A-266E may comprise printed ink made from one or more chemical elements selected from a list consisting of silver, gold, copper and platinum, and/or from any suitable alloy comprising at least one of these elements. For example, at least some of traces 264A-264E and 266A-266E may comprise a printed ink made from a silver-based alloy, such as but not limited to silver-carbon, silver-chloride, or silver-nickel.

In some embodiments, at least one of the target zone traces (e.g., traces 271, 273 and 275) is made from ink having different (e.g., smaller) electrical conductivity compared to that of at least some of traces 264A-264E and 266A-266E of the periphery area outside the target zones. In other words, the periphery area has smaller resistivity relative to the target zone, and therefore has higher sensitivity to a change in conductivity caused by a projectile hit. In such embodiments, this configuration improves the detectability of a projectile hitting the target zone.

In some embodiments, the traces of at least one of the target zone and periphery area of shooting target 260 may comprise a large variety of alloying elements. For example, one or more chemical elements selected from a list consisting of: (a) silver, (b) copper, (c) gold, (d) aluminum, (e) calcium, (f) tungsten, (g) zink, (h) nickel, (i) lithium, (j) iron, (k) platinum, (l) tin, (m) gallium, (n) niobium, (o) lead, (p) titanium, (q) mercury, (r) manganese, and (s) carbon, or any other suitable chemical elements, or any suitable combination thereof.

As described above, the voltage measured in a given shooting section, e.g., shooting section 269, depends on whether or not a hit occurred in this shooting section. In case of a projectile hit, the measured voltage depends on the hit location within the given shooting section. Since the ink conductivity and the density of traces differ between the target zone and the periphery, different voltage levels are typically measured when the hit occurred, for example, at target zone 262E and at traces 264E of the respective periphery area of shooting section 269.

In an embodiment, controller 40 in target assembly 28 is configured to detect a hit in a given section based on the voltage level measured on a respective connector pair of this section (e.g., connectors 268A and 270). In this example embodiment, controller 40 is configured to detect whether or not a projectile hit occurred at the respective shooting section, and to distinguish whether the hit occurred at target zone 262A or at one or more traces 264A of the periphery area. In other words, controller 40 is configured to determine the location in which the projectile physically hits target 260.

In some embodiments, wireless communication device 42 is configured to wirelessly send RF signals 44 conveying a location signal, indicative of the location in which the projectile physically hits target 260. As described in FIG. 1 above, device 42 may convey signals 44 to a wireless communication device 43 coupled to goggles 24, or to any other suitable wireless communication device of system 20.

The layout of target 260 is shown by way of example in order to illustrate certain embodiments, such as sensing and reporting the position of a projectile hit a in a multi-sectional non-uniform target. Embodiments of the present invention, however, are by no means limited to this specific layout, and the principles described herein may similarly be applied to other suitable layouts and/or suitable types of shooting targets. For example, in alternative embodiments, the target zone may have smaller resistivity relative to the periphery area, and therefore may have higher sensitivity to a change in conductivity caused by a projectile hit. In yet other embodiments, the target zone and periphery area may have similar resistivity.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:
1. A shooting target assembly, comprising:
   a substrate having a plurality of first sections and a plurality of second sections;
   a plurality of first patterns on the first sections, the first patterns formed of a first conductive ink having a first electrical conductivity;
   a plurality of second patterns on the second sections, the second patterns formed of a second conductive ink having a second electrical conductivity, different from the first electrical conductivity;

a reference conductor common to the first pattern and the second pattern;

an additional conductor common to the first pattern and the second pattern; and an interface on the substrate, the interface being electrically connected to the reference conductor and the additional reference conductor in a manner enabling control circuitry connected to the interface to flow a current via the reference conductor and the additional conductor to measure a change in an electrical parameter between the reference conductor and the additional conductor, and to thereby distinguish between a physical hit of a projectile in one of the plurality of the first sections or in one of the plurality of the second sections based on the change in the electrical parameter.

2. The shooting target assembly according to claim 1, wherein the first and second patterns are electrically coupled to one another.

3. The shooting target assembly according to claim 1, wherein the first section comprises at least a target zone and the second section comprises a periphery area outside the target zone.

4. The shooting target assembly according to claim 1, wherein the first conductive ink comprises one or more materials selected from a list consisting of: (a) platinum, (b) graphene, (c) graphite, and (d) carbon having an allotrope different than graphene or graphite.

5. The shooting target assembly according to claim 1, wherein the second conductive ink comprises one or more materials selected from a list consisting of: (a) platinum, (b) silver, (c) gold, (d) copper, (e) an alloy comprising silver and carbon, (f) an alloy comprising silver and chlorine, (g) an alloy comprising silver and nickel.

6. The shooting target assembly according to claim 1, wherein the control circuitry is configured to detect a hit event by analyzing a plurality of changes of the electrical parameter over time.

7. The shooting target assembly according to claim 1, wherein the electrical parameter comprises a parameter selected from a list consisting of: (a) voltage, (b) electrical resistance, and (c) the electrical current.

8. The shooting target assembly according to claim 1, wherein the control circuitry is configured to hold at least one threshold, and to detect, based on the at least one threshold, whether the physical hit occurred at the first section or the second section.

9. The shooting target assembly according to claim 1, wherein the control circuitry includes a wireless communication device configured to send a signal indicative of whether the physical hit occurred at the first section or the second section.

10. The shooting target assembly according to claim 1, wherein at least one of the first and second conductive inks comprises a material selected from a list consisting of: (a) silver, (b) copper, (c) gold, (d) aluminum, (e) calcium, (f) tungsten, (g) zinc, (h) nickel, (i) lithium, (j) iron, (k) platinum, (l) tin, (m) gallium, (n) niobium, (o) lead, (p) titanium, (q) mercury, (r) manganese, and (s) carbon.

11. The shooting target assembly according to claim 1, wherein the first and second patterns comprise one or more electrical traces, and differ from one another in a spatial density of the electrical traces.

12. A shooting target assembly, comprising:
a substrate having at least one first section and at least one second section;

a first pattern of electrical traces on the at least one first section and a second differing pattern of electrical traces on the at least one second;

a reference conductor common to the first pattern and the second patterns;

an additional conductor common to the first pattern and second pattern; and an interface on the substrate, the interface being electrically connected to the reference conductor and the additional conductor in a manner enabling control circuitry connected to the interface to measure a change in an electrical parameter between the reference conductor and the additional conductor, and to thereby distinguish and report whether a physical hit of a projectile occurred in the at least one first section or in the at least one second section based on the change in the electrical parameter.

13. The shooting target assembly according to claim 12, wherein the first and second patterns are electrically coupled to one another.

14. The shooting target assembly according to claim 12, wherein the first and second patterns differ from one another in a spatial density of the electrical traces.

15. The shooting target assembly according to claim 12, wherein the electrical parameter comprises a parameter selected from a list consisting of: (a) voltage, (b) electrical resistance, and (c) the electrical current.

16. The shooting target assembly according to claim 12, wherein the first pattern comprises a first conductive ink having a first electrical conductivity, and the second pattern comprises a second conductive ink having a second electrical conductivity, different from the first electrical conductivity.

17. The shooting target assembly according to claim 12, wherein the first conductive ink comprises one or more materials selected from a list consisting of: (a) platinum, (b) graphene, (c) graphite, and (d) carbon having an allotrope different than graphene or graphite, and wherein the second conductive ink comprises one or more materials selected from a list consisting of: (a) platinum, (b) silver, (c) gold, (d) copper, (e) an alloy comprising silver and carbon, (f) an alloy comprising silver and chlorine, (g) an alloy comprising silver and nickel.

18. A control circuit for connection to a shooting target assembly, the control circuit comprising:
at least one processor configured to perform operations including:
flowing a current via a reference conductor on a substrate, the substrate having a plurality of first patterns in first sections thereof and a plurality of second patterns in second sections thereof, wherein the first and second patterns are respectively formed of a first conductive ink having a first electrical conductivity, and a second conductive ink having a second electrical conductivity, and wherein the reference conductor is common to the first pattern and the second pattern;

receiving the current via an additional conductor on the printed substrate, the additional conductor being common to the first pattern and the second pattern;

measuring a change in an electrical parameter between the reference conductor and the additional conductor; and based on the measuring, distinguishing between a physical projectile hit on the substrate in one of the plurality of the first sections or in one of the second plurality of sections.

19. The control circuit according to claim 18, wherein the at least one processor is configured detect whether the physical hit occurred in one of the plurality of first sections or in one of a plurality of second sections based on a comparison of the change in the electrical parameter to a threshold.

20. The control circuit according to claim 18, wherein the operations further include sending a signal indicative of whether the physical hit occurred in at least one of the first sections or in at least one of the second sections.

21. The control circuit according to claim 18, wherein the electrical parameter is selected from a group consisting of: (a) voltage, (b) electrical resistance, and (c) the current.

\* \* \* \* \*